United States Patent [19]
Carr et al.

[11] Patent Number: 5,167,762
[45] Date of Patent: Dec. 1, 1992

[54] ANISOTROPIC ETCH METHOD

[75] Inventors: Robert C. Carr; David A. Cathey, both of Boise, Id.

[73] Assignee: Micron Technology, Inc., Boise, Id.

[21] Appl. No.: 638,295

[22] Filed: Jan. 2, 1991

[51] Int. Cl.$^5$ ............................................. H01L 21/00
[52] U.S. Cl. .................................... 156/657; 156/646; 156/643; 156/651; 156/662
[58] Field of Search ............... 156/643, 651, 653, 662, 156/656, 657, 646

[56] References Cited

U.S. PATENT DOCUMENTS

| | | | |
|---|---|---|---|
| 4,572,759 | 2/1986 | Benzing | 204/298.37 |
| 4,799,991 | 1/1989 | Dockrey | 156/643 |
| 4,818,334 | 4/1989 | Shwartzman et al. | 156/662 |
| 4,855,017 | 8/1989 | Douglas | 156/651 |
| 4,886,569 | 12/1989 | Ojha et al. | 156/651 |
| 5,007,982 | 4/1991 | Tsou | 156/643 |
| 5,013,398 | 5/1991 | Long et al. | 156/651 |

*Primary Examiner*—Brian E. Hearn
*Assistant Examiner*—George Goudreau
*Attorney, Agent, or Firm*—Stanley N. Protigal

[57] ABSTRACT

A method to anisotropically etch an oxide/poly/oxide or an oxide/poly/oxide sandwich structure on a silicon wafer substrate in situ, that is, using a single parallel plate plasma reactor chamber and a single inert cathode, with a variable gap between cathode and anode. This method has an oxide etch step and a silicide/poly etch step. In the poly removal step, helium is added to improve etch uniformity. The pressure, power, and various gas quantities are balanced to produce the fastest etch rates while preserving selectivity. The fully etched sandwich structure has a vertical profile at or near 90° from horizontal.

16 Claims, 2 Drawing Sheets

ANISOTROPIC ETCH METHOD

FIELD OF THE INVENTION

The present invention relates to etching methods used in the fabrication of integrated electronic circuits on a semiconductor substrate such as silicon, particularly a single-chamber/single-cathode (in situ) method of anisotropically plasma etching a sandwich structure of an oxide, metallic structure such as polycrystalline silicon, and dielectric, or equivalent structure.

BACKGROUND OF THE INVENTION

An electronic circuit is chemically and physically integrated into a substrate such as a silicon wafer by patterning regions in the substrate, and by patterning layers on the substrate. These regions and layers can be conductive, for conductor and resistor fabrication, or insulative, for insulator and capacitor fabrication. They can also be of differing conductivity types, which is essential for transistor and diode fabrication. Degrees of resistance, capacitance, and conductivity are controllable, as are the physical dimensions and locations of the patterned regions and layers, making circuit integration possible. Fabrication can be quite complex and time consuming, and therefore expensive. It is thus a continuing quest of those in the semiconductor fabrication business to reduce fabrication times and costs of such devices in order to increase profits. Any simplified processing step or combination of processes at a single step becomes a competitive advantage.

One processing step is referred to as "in situ etch". "in situ etch" includes patterning photoresist on top of an oxide ($SiO_2$) and silicon (usually deposited polysilicon, or "poly") sandwich, followed by an etch process. Both the oxide and the subjacent poly are etched inside a single etch chamber, followed by resist strip. The present invention is directed to controlling etch patterns during in situ etch.

In this disclosure, "sccm" denotes standard cubic centimeters per minute, and "gap" refers to the distance between plasma electrodes, one of which supports the wafer. After the oxide etch step, which takes under a minute, the structure appears as shown in FIG. 2.

A situation where a process simplification is desirable is in the anisotropic etch of a layer of oxide on a layer of polysilicon (poly). Oxide is an insulator with dielectric properties, and is often layered with other dielectrics such as nitride. Poly is resistive in nature, but is made less resistive when doped with an element having less or more than four valence electrons, or when layered with conductive silicide.

A combination of oxide and poly presents a difficult etching task, particularly with an additional mask layer of photoresist ("resist"), which must be the case if patterning is desired. The difficulty is due to the distinct differences in the way oxide and poly are etched, particularly with resist still present on top of the structure.

While oxide formation is useful in selective etching of poly, oxidizing materials are generally not used when etching silicon past a photomask because photoresist masks do not withstand oxygen environments very well.

Both oxide and poly can be etched using a parallel plate plasma reactor. However, an oxide is typically etched in fluorine deficient fluorocarbon based plasmas, whereas poly can be etched in fluorine or chlorine based discharges. Reactor cathode materials may also differ. Using conventional methods, the two steps are incompatible.

Oxide etch in general is fairly well understood, given a universal need for a vertical profile. This vertical profile is realized primarily by ion induced reaction with the oxide, coupled with normal incidence of the ions onto the oxide surface. The amount and energy of these ions are primarily controlled by the reactor's rf power and gap. Generally, a fluorocarbon-based gas mixture is introduced at a low pressure into the etch chamber. The exact gas composition is chosen, and an erodible cathode is used to scavenge excessive fluorine radicals so that the fluorine-to-carbon ratio is near, but not beyond, the so-called polymerization point. Under these conditions, when a plasma is ignited, the fluorocarbons are dissociated and release fluorine radicals and $CF_x$ species. Although fluorine radicals etch oxide, they do so very slowly: the primary etchant for oxide is considered to be the $CF_x$ species. Some of these species diffuse to the oxide surface where, with the assistance of ion bombardment, they react with the oxide and release volatile byproducts $SiF_4$, $CO$, and $CO_2$. In addition, some of the $CF_x$ species react with each other to form fluorocarbon polymers. Polymer that forms on horizontal surfaces is removed by vertical ion bombardment. Polymer that forms on vertical sidewalls is not significantly degraded by the bombardment, and actually serves a useful purpose by protecting the sidewalls from attack by the etchant species. This sidewall protection enables the achievement of vertical profiles, adjustable by varying the fluorine-to-carbon ratio. As the cathode is eroded, the quantity of available fluorine radicals is reduced. Therefore, a polymer-producing gas such as $CHF_3$ is balanced against a fluorine producing gas such as $CF_4$ to provide proper selectivity, with assistance to sidewall protection.

Two methods are presently used to etch an oxide/silicide/poly sandwich structure. Both methods use separate reactors: one for oxide etch, and one for polycide etch. The first method involves etching the oxide in an oxide etch reactor, using an erodible cathode. After oxide etch, the resist is removed from the wafer. Silicide and poly are then etched in a poly etch reactor, using an inert cathode. Both etches are anisotropic.

The second method uses the same principles as the first, except that there are two reactors in one machine. The two reactors are configured as separate oxide and polycide reactors having a common vacuum transfer area, so that a wafer can be transferred in a vacuum from the oxide reactor to the polycide reactor, thus minimizing additional handling. The resist is generally not removed prior to polycide etch in this method. This is sometimes referred to as "in situ" since the wafers never leave the vacuum of one machine. However, they are etched in two different etch chambers and are not truly in situ in the sense of this disclosure.

It would be of great advantage to etch oxide and polycide truly "in situ", that is, in one reactor chamber, with a single cathode. An object of the present invention is to provide a method of anisotropically etching an oxide/silicide/poly sandwich structure in situ. Other objects of the invention are a fast processing time, and improved process yield and cleanliness.

In the in situ etch process, it would be desireable to allow anisotropic etching of the silicon after the oxide is patterned and after resist is stripped. It is further desireable to improve cleanliness and repeatability in order to simplify the process and provide tighter controls over dimensions.

SUMMARY OF THE INVENTION

In summary, the inventive process is as follows. A wafer having the sandwich structure described above, coated with a mask layer of resist, is transferred into the chamber of a parallel plate plasma reactor, having an anodized aluminum cathode and a variable gap, for two steps: oxide etch and polycide etch. In the oxide etch step, oxide not protected by resist is exposed to a plasma etch. This etch step is accomplished with a directional plasma etcher.

After the etching of the oxide, the exposed silicon is directionally etched. The directional plasma etch process uses a mixture of an oxidizing gas, (with respect to silicon) and an etchant gas, i.e. chlorine/fluorine source. The oxide serves as a patterning mask on top of silicon, but the side wall of the silicon being etched will be oxidized, while allowing anisotropic etching.

The process includes applying a pre-etch formation of oxide in a pattern which will be the etch pattern for polysilicon. This is followed by application of plasma in an atmosphere of $NF_3$, $O_2$ He, and $Cl_2$. This treatment removes the poly in the pattern defined by the oxide. In order to provide an anisotropic etch, the atmosphere is formulated to allow the formation of a thin oxide film on the poly sidewalls, without blocking the intentional plasma erosion in the preferred downward direction. The oxide film is then stripped in an appropriate atmosphere, such as $NF_3$ and HBr.

If a directional plasma etcher uses a mixture of an oxidizing gas, (with respect to silicon) and an etchant gas, i.e. Chlorine/Fluorine source with a silicon dioxide patterning mask on top of silicon, the side wall will be oxidized, and allow anisotropic etching. While standard photoresist masks can not hold up in Oxygen environments well, the addition of the oxidizing gas promotes the desired anisotropic etch.

Due to the fact that the oxide is being used instead of the photomask, the oxidizing environment does not present a mask erosion problem. The process permits the use of the oxidizing gas in a process in which a photomask is used to define the etch pattern. Thus, both dielectric and silicon can be etched with increased anisotropicity.

DETAILED DESCRIPTION OF THE PREFERRED EMBODIMENT

Figure 1:
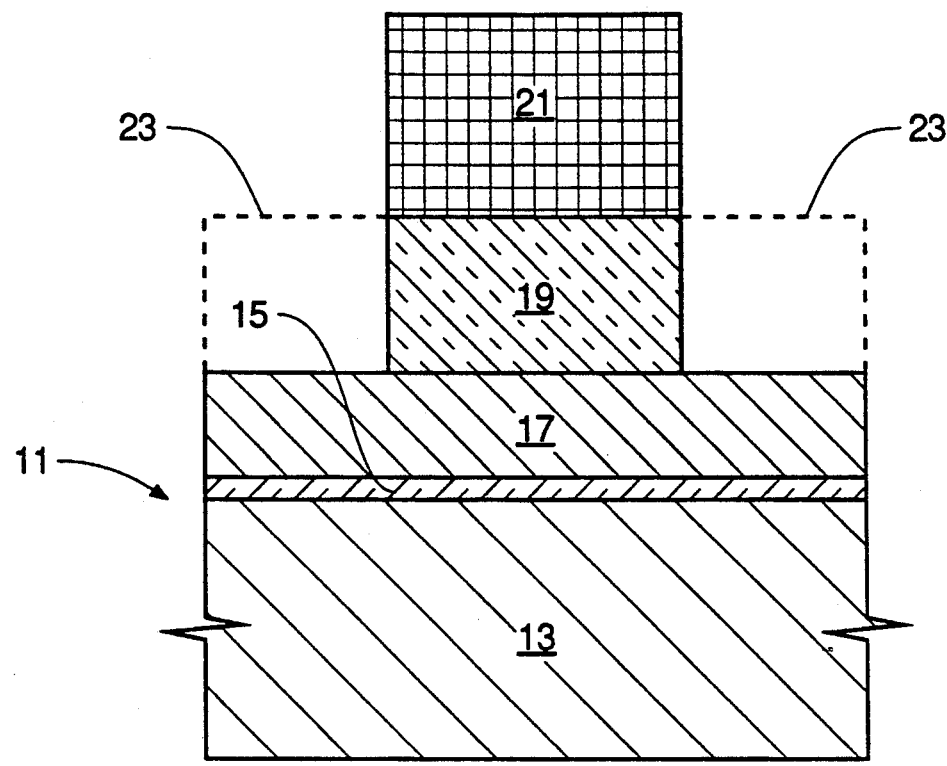
FIG. 1 shows a cross-sectioned oxide/poly/oxide sandwich structure with a patterned resist mask layer, prior to the inventive etch.
Figure 2:
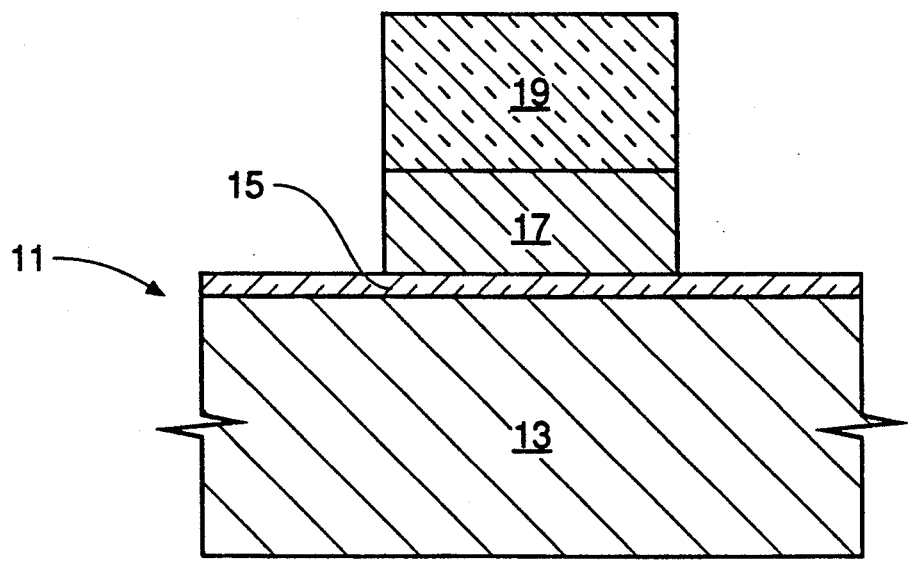
FIG. 2 shows a cross-section of said structure after oxide etch.
Figure 3:
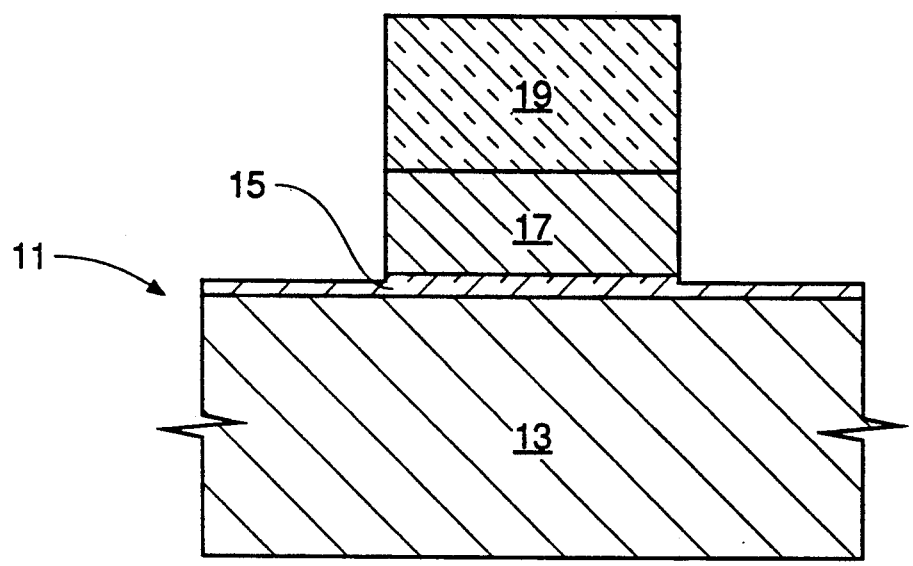
FIG. 3 shows a cross-section of said structure after overetch.

A wafer 11 having a sandwich structure of a substrate 13, initial or gate dielectric 15 over the substrate 13, a conductive or semiconductive layer 17 over the gate dielectric 15, and a top layer of dielectric 19 is shown in FIG. 1. In the preferred embodiment, a silicon wafer is used, and the gate dielectric 15 includes silicon oxide. The preferred form of gate dielectric is $SiO_2$, which is grown from the substrate material. The semiconductive layer 17 is polysilicon (although amorphous silicon would have related etch properties and would be an acceptable substitute). The top layer of dielectric 19 is, in the preferred embodiment, deposited as TEOS oxide (an oxide of silicon, derived from tetraethylorthosilicate). Of course, the inventive techniques can work on a wide variety of material combinations.

As illustrated in FIG. 1, a photoresist mask layer 21 is aligned and developed on the top layer 19. Fabrication and masking of this structure are done by methods well known to those skilled in semiconductor design and processing, and hence are not fully disclosed herein. The preferred embodiment of the inventive method is well suited to etch a layer of the TEOS oxide 19 on a layer of poly 17. The photomask 21 defines an etch pattern, as shown in FIG. 1, with oxide to be removed indicated by dashed lines 23.

In the preferred embodiment, the wafer 11, having the masked structure, is transferred into the chamber of a plasma reactor, such as a Lam 790 parallel plate reactor, having an anodized aluminum cathode, a variable gap, and a 13.56 MHz rf power plasma generator for an inventive process having two steps: oxide etch and polycide etch. Alternatively, a Tegal 1511 reactor is used.

In this etch step, polysilicon not protected by oxide, or other appropriate non erodible material, is exposed to a plasma of about 4 to 24 $W/cm^2$ power density at a 0.25 to 8 cm gap, in a 0 to 1 torr atmosphere of 1.0 sccm $NF_3$, 2.5 sccm $O_2$-He mixture (typically 0-10 sccm $O_2$ and 0-100 sccm He), and 7.0 sccm $Cl_2$. This treatment removes the poly layer 17. The finished structure has a vertical profile at or near 90° from horizontal, with no bowing or notching. This part of the etch process takes about 2-5 minutes.

The plasma etch is continued until the poly layer 17 is removed to a desired depth, usually completely to the gate dielectric 15. It is then desired to overetch the poly layer 17, in order to avoid stringers and other defects. This is preferably done in an atmosphere of 10.0 sccm of $NF_3$ and 3.0 sccm of HBr, applied as a plasma etch. This etch is preferential to the poly 17 and therefore is less destructive to the underlying gate oxide 15.

This step is accomplished immediately after the poly etch step, in the same chamber and using the same cathode. The finished structure has a vertical profile at or near 90° from horizontal, with no bowing or notching.

In the poly removal step, helium is added to improve etch uniformity. The pressure, power, and various gas quantities are balanced to produce the fastest etch rates while preserving selectivity.

Clearly, in view of the above disclosure, other embodiments of this invention will present themselves to those of ordinary skill in semiconductor processing, such as applying the invention to other kinds of masking layers, oxide, silicide, and poly, and varying thickness and doping of each layer etched. Since the inventive process includes one step for polycide etch, an oxide/silicide/poly structure can be etched instead of a simple oxide/poly structure, without materially altering the process. It is also conceivable that plasma power density and gap may be varied, gas quantities adjusted, similar gases substituted, or some other inert material used for the cathode, to achieve same or similar results. Gas quantities may also be changed while preserving essentially similar ratios of one gas to another. Another make of reactor might also be chosen. These variations and others are intended to be circumscribed by these claims.

We claim:

1. A method to anisotropically etch a structure on a wafer comprising a semiconductor material superadjacent to a dielectric, producing a profile at or near 90° from horizontal, comprising the steps of:
   a) forming a further dielectric layer over said semiconductor;
   b) defining an etch pattern for the semiconductor material and the dielectric which is subjacent to said semiconductor material;
   c) etching the further dielectric anisotropically substantially in said defined etch pattern for the semiconductor;
   d) providing an atmosphere of 0 to 1 torr within said reactor, containing $NF_3$, $O_2$, He, and $Cl_2$;
   e) exposing the wafer to a plasma having a power density of 4 to 24 $W/cm^2$, thereby etching the semiconductor material in a pattern corresponding to the pattern etched on the further dielectric; and
   f) further etching said structure in an atmosphere which provides a more preferential etch for the semiconductor material than that provided by said atmosphere containing $NF_3$, $O_2$, He, and $Cl_2$, said further etching resulting in the pattern defined for the semiconductor material at or near 90° from horizontal being retained.

2. The method of claim 1, wherein:
said further etching being performed using an atmosphere containing $NF_3$, and HBr.

3. The method of claim 1, wherein:
   a) said further dielectric layer formed over said semiconductor including oxide;
   b) providing a parallel plate plasma etch reactor, having a first electrode whereupon the substrate is mounted, and having an inert second electrode; and
   c) exposing the further oxide to a plasma, thereby etching the further dielectric anisotropically substantially in said defined etch pattern for the semiconductor.

4. The method of claim 1, wherein:
the semiconductor material comprises silicon; and
the dielectric subjacent to the semiconductor material comprises silicon dioxide.

5. The method of claim 1, wherein:
said atmosphere for providing a more preferential etch containing approximately 1.0 sccm $NF_3$, $O_2$ and He, wherein the total flow of $O_2$ and He is approximately 2.5 sccm, and approximately 7.0 sccm $Cl_2$.

6. The method of claim 5, wherein:
said further etching being performed in an atmosphere containing approximately 10.0 sccm of $NF_3$ and 3.0 sccm of HBr.

7. The method of claim 1, wherein:
   a) a gap within approximately 0.25 to 8.0 cm exists between said first and second electrodes; and
   b) said inert second electrode is anodized aluminum.

8. The method of claim 1, wherein:
said inert second electrode is anodized aluminum.

9. The method of claim 10, wherein:
said inert second electrode is anodized aluminum.

10. A method to anisotropically etch at least one layer of silicon semiconductor material, on a substrate, producing a profile at or near 90° from horizontal, comprising the steps of:
    a) forming a further dielectric layer over said semiconductor;
    b) defining an etch pattern for the semiconductor material and the dielectric which is subjacent to said semiconductor material;
    c) etching the further dielectric anisotropically substantially in said defined etch pattern for the semiconductor;
    d) providing an atmosphere of 0 to 1 torr within said reactor, containing $NF_3$, $O_2$, He, and $Cl_2$;
    e) exposing the wafer to a plasma having a power density of 4 to 24 $W/cm^2$, thereby etching the semiconductor material in a pattern corresponding to the pattern etched on the further dielectric; and
    f) further etching in an atmosphere which provides a more preferential etch for the semiconductor material than that provided by said atmosphere containing $NF_3$, $O_2$, He, and $Cl_2$, said further etching resulting in the pattern defined for said layer of semiconductor material at or near 90° from horizontal being retained.

11. The method of claim 10, wherein:
said semiconductor material comprises poly.

12. The method of claim 10, wherein:
said further etching being performed using an atmosphere containing $NF_3$, and HBr.

13. The method of claim 10, wherein:
   a) said further dielectric layer formed over said semiconductor including oxide;
   b) providing a parallel plate plasma etch reactor, having a first electrode whereupon the substrate is mounted, and having an inert second electrode; and
   c) exposing the further oxide to a plasma, thereby etching the further dielectric anisotropically substantially in said defined etch pattern for the semiconductor.

14. The method of claim 10, wherein:
said atmosphere for providing a more preferential etch containing approximately 1.0 sccm $NF_3$, $O_2$ and He, wherein the total flow of $O_2$ and He is approximately 2.5 sccm, and approximately 7.0 sccm $Cl_2$.

15. The method of claim 14, wherein:
said further etching being performed in an atmosphere containing approximately 10.0 sccm of $NF_3$ and 3.0 sccm of HBr.

16. The method of claim 10, wherein:
   a) a gap within approximately 0.25 to 8.0 cm exists between said first and second electrodes; and
   b) said inert second electrode is anodized aluminum.

* * * * *